(12) United States Patent
Chen

(10) Patent No.: US 10,680,035 B1
(45) Date of Patent: Jun. 9, 2020

(54) MICRO LIGHT-EMITTING DIODE DISPLAY DEVICE AND MICRO LIGHT-EMITTING DIODE DRIVING CIRCUIT

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/351,511

(22) Filed: Mar. 12, 2019

(51) Int. Cl.

| | |
|---|---|
| H01L 27/15 | (2006.01) |
| H01L 29/786 | (2006.01) |
| H01L 29/423 | (2006.01) |
| H01L 33/62 | (2010.01) |
| H01L 49/02 | (2006.01) |
| H01L 33/36 | (2010.01) |
| H01L 33/14 | (2010.01) |

(52) U.S. Cl.
CPC .............. *H01L 27/15* (2013.01); *H01L 28/40* (2013.01); *H01L 29/42364* (2013.01); *H01L 29/42384* (2013.01); *H01L 29/78648* (2013.01); *H01L 29/78669* (2013.01); *H01L 29/78696* (2013.01); *H01L 33/14* (2013.01); *H01L 33/36* (2013.01); *H01L 33/62* (2013.01)

(58) Field of Classification Search
CPC . H01L 51/56; H01L 51/5072; H01L 51/5012; H01L 27/3244; H01L 35/32
USPC ............................................................ 257/71
See application file for complete search history.

(56) References Cited

U.S. PATENT DOCUMENTS

| 2016/0013170 A1* | 1/2016 | Sakariya | ................ H01L 33/42 257/13 |
|---|---|---|---|
| 2016/0197232 A1* | 7/2016 | Bour | ...................... H01L 33/24 257/13 |
| 2018/0174519 A1* | 6/2018 | Kim | .................... G09G 3/3233 |

* cited by examiner

*Primary Examiner* — Andy Huynh
(74) *Attorney, Agent, or Firm* — CKC & Partners Co., LLC

(57) ABSTRACT

A micro light-emitting diode display device including a driving transistor and a micro light-emitting diode is provided. The driving transistor includes a substrate, a gate, a gate insulator, a semiconductor layer, a drain electrode, and a source electrode. The gate insulator has a thickness less than or equal to about 500 angstroms. The micro light-emitting diode has a lateral length less than or equal to about 50 μm and is electrically connected to one of the source electrode and the drain electrode. A current injection channel is extended within one of a first type semiconductor layer and a second type semiconductor layer of the micro light-emitting diode and is spaced apart from a side surface of the micro light-emitting diode. A lateral length a light-emitting portion of an active layer of the micro light-emitting diode is less than or equal to about 10 μm.

12 Claims, 9 Drawing Sheets

MICRO LIGHT-EMITTING DIODE DISPLAY DEVICE AND MICRO LIGHT-EMITTING DIODE DRIVING CIRCUIT

BACKGROUND

Field of Invention

The present disclosure relates to a low power micro light-emitting diode display device and a low power micro light-emitting diode driving circuit.

Description of Related Art

The statements in this section merely provide background information related to the present disclosure and do not necessarily constitute prior art.

In recent years, micro devices have become popular in various applications. One of the promising subfields is micro light-emitting diode devices, and one of the important issues of said subfield is the power consumption of a micro light-emitting diode driving circuit.

SUMMARY

According to some embodiments of the present disclosure, a micro light-emitting diode display device including a driving transistor and a micro light-emitting diode is provided. The driving transistor includes a substrate, a gate, a gate insulator, a semiconductor layer, a drain electrode, and a source electrode. The gate is on the substrate. The gate insulator has a thickness less than or equal to about 500 angstroms and is on the gate and the substrate. The semiconductor layer is on the gate insulator. The drain electrode is on the semiconductor layer. The source electrode is on the semiconductor layer and is spaced apart from the drain electrode. The micro light-emitting diode has a lateral length less than or equal to about 50 μm and is electrically connected to one of the source electrode and the drain electrode. The micro light-emitting diode includes a first type semiconductor layer, an active layer, and a second type semiconductor layer. The active layer is on and joined with the first type semiconductor layer. The second type semiconductor layer is on and joined with the active layer. A current injection channel is extended within one of the first type semiconductor layer and the second type semiconductor layer and is spaced apart from a side surface of the micro light-emitting diode, and the active layer has a portion in contact with the current injection channel and having a lateral length less than or equal to about 10 μm.

According to some embodiments of the present disclosure, a micro light-emitting diode display device including a driving transistor and a micro light-emitting diode is provided. The driving transistor includes a substrate, a semiconductor layer, a drain electrode, a source electrode, a gate insulator, and a gate. The semiconductor layer is on the substrate. The drain electrode is on the semiconductor layer. The source electrode is on the semiconductor layer and is spaced apart from the drain electrode. The gate insulator has a thickness less than or equal to about 500 angstroms and is on the semiconductor layer. The gate is on the gate insulator. The micro light-emitting diode has a lateral length less than or equal to about 50 μm and is electrically connected to one of the source electrode and the drain electrode. The micro light-emitting diode includes a first type semiconductor layer, an active layer, and a second type semiconductor layer. The active layer is on and joined with the first type semiconductor layer. The second type semiconductor layer is on and joined with the active layer. A current injection channel is extended within one of the first type semiconductor layer and the second type semiconductor layer and is spaced apart from a side surface of the micro light-emitting diode, and the active layer has a portion in contact with the current injection channel and having a lateral length less than or equal to about 10 μm.

According to some embodiments of the present disclosure, a micro light-emitting diode driving circuit including a storage capacitor, a switching transistor, a micro light-emitting diode, and a driving transistor is provided. The storage capacitor has two ends. The switching transistor has a gate terminal connected to a scan line, a drain terminal connected to a data line, and a source terminal connected to one end of the storage capacitor. The micro light-emitting diode has a lateral length less than or equal to about 50 μm and includes a first type semiconductor layer, an active layer, and a second type semiconductor layer. The active layer is on and joined with the first type semiconductor layer. The second type semiconductor layer is on and joined with the active layer. A current injection channel is extended within one of the first type semiconductor layer and the second type semiconductor layer and is spaced apart from a side surface of the micro light-emitting diode, and the active layer has a portion in contact with the current injection channel and having a lateral length less than or equal to about 10 μm. The micro light-emitting diode has an anode and a cathode respectively connected to the first type semiconductor layer and the second type semiconductor layer. The micro light-emitting diode receives a first driving voltage from a driving voltage source. The micro light-emitting diode is electrically connected to a low voltage source. The driving transistor has a gate terminal, a drain terminal, and a source terminal. The gate terminal is connected to the source terminal of the switching transistor. The micro light-emitting diode is electrically connected to one of the source terminal and the drain terminal of the driving transistor. The driving transistor receives a second driving voltage from a driving voltage source and is electrically connected to the low voltage source. The driving transistor is one of a first structure, a second structure and a third structure. The first structure includes a first substrate, a first gate, a first gate insulator, a first semiconductor layer, a first drain electrode, and a first source electrode. The first gate is on the first substrate. The first gate insulator having a thickness less than or equal to about 500 angstroms is on the first gate and the first substrate. The first semiconductor layer is on the first gate insulator. The first drain electrode is on the first semiconductor layer. The first source electrode is on the first semiconductor layer and is spaced apart from the first drain electrode. The second structure includes a second substrate, a second gate, a second gate insulator, a second semiconductor layer, a second drain electrode, a second source electrode, a top gate insulator, and a top gate. The second gate is on the second substrate. The second gate insulator having a thickness less than or equal to about 500 angstroms is on the second gate and the second substrate. The second semiconductor layer is on the second gate insulator. The second drain electrode is on the second semiconductor layer. The second source electrode is on the second semiconductor layer and is spaced apart from the second drain electrode. The top gate insulator is on the second semiconductor layer. The top gate is on the top gate insulator. The third structure includes a third substrate, a third semiconductor layer, a third drain electrode, a third source electrode, a third gate insulator, and a third gate. The third semiconductor layer is on the third substrate. The third drain electrode is on the third semiconductor layer. The third source electrode is on the third semiconductor layer and is spaced apart from the third drain electrode. The third gate insulator having a thickness less than or equal to about 500 angstroms is on the third semiconductor layer. The third gate is on the third gate insulator.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
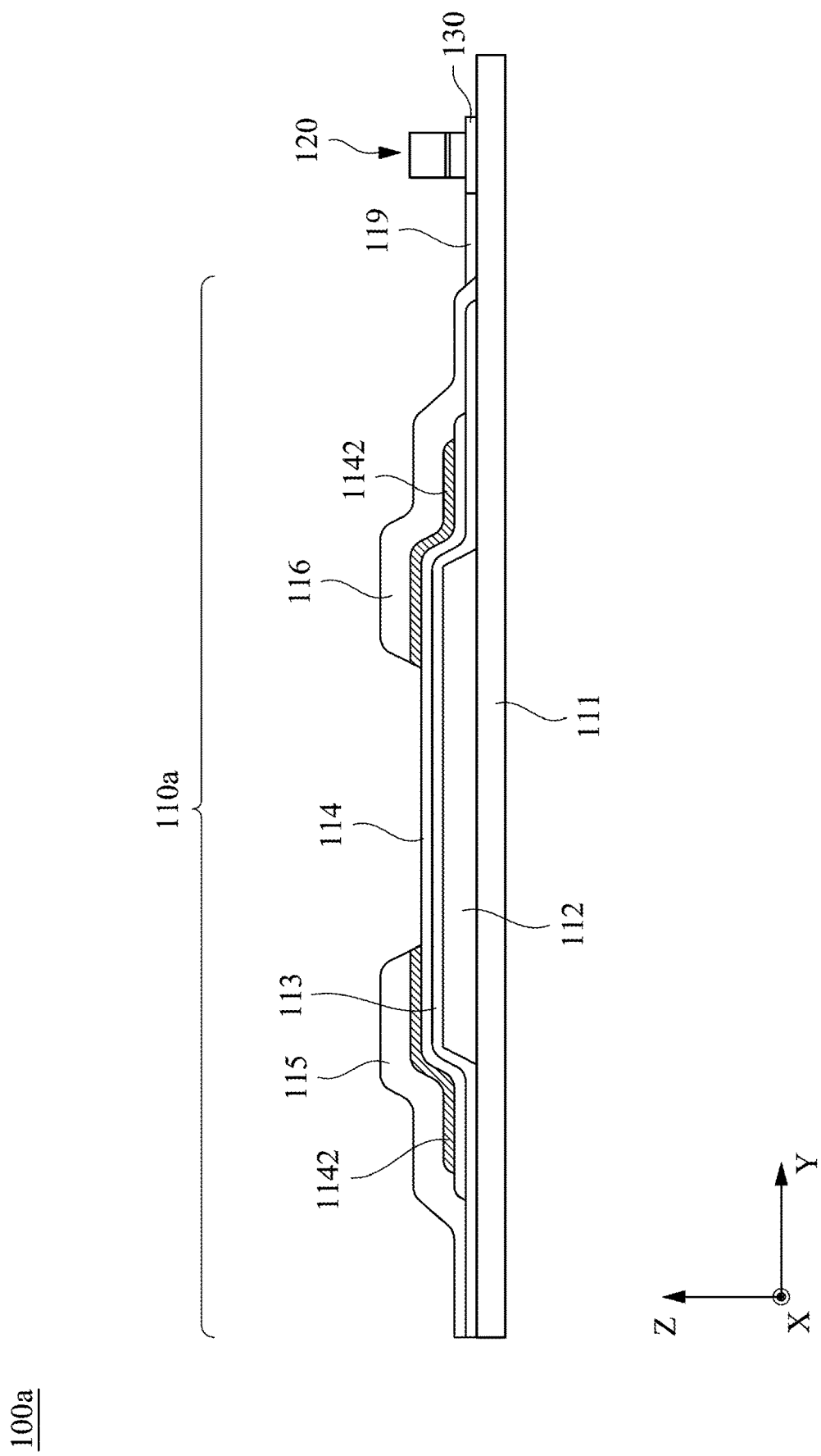
FIG. 1A is a cross-sectional view of a micro light-emitting diode display device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Although most of terms described in the following disclosure use singular nouns, said terms may also be plural in accordance with figures or practical applications.

Figure 1B:
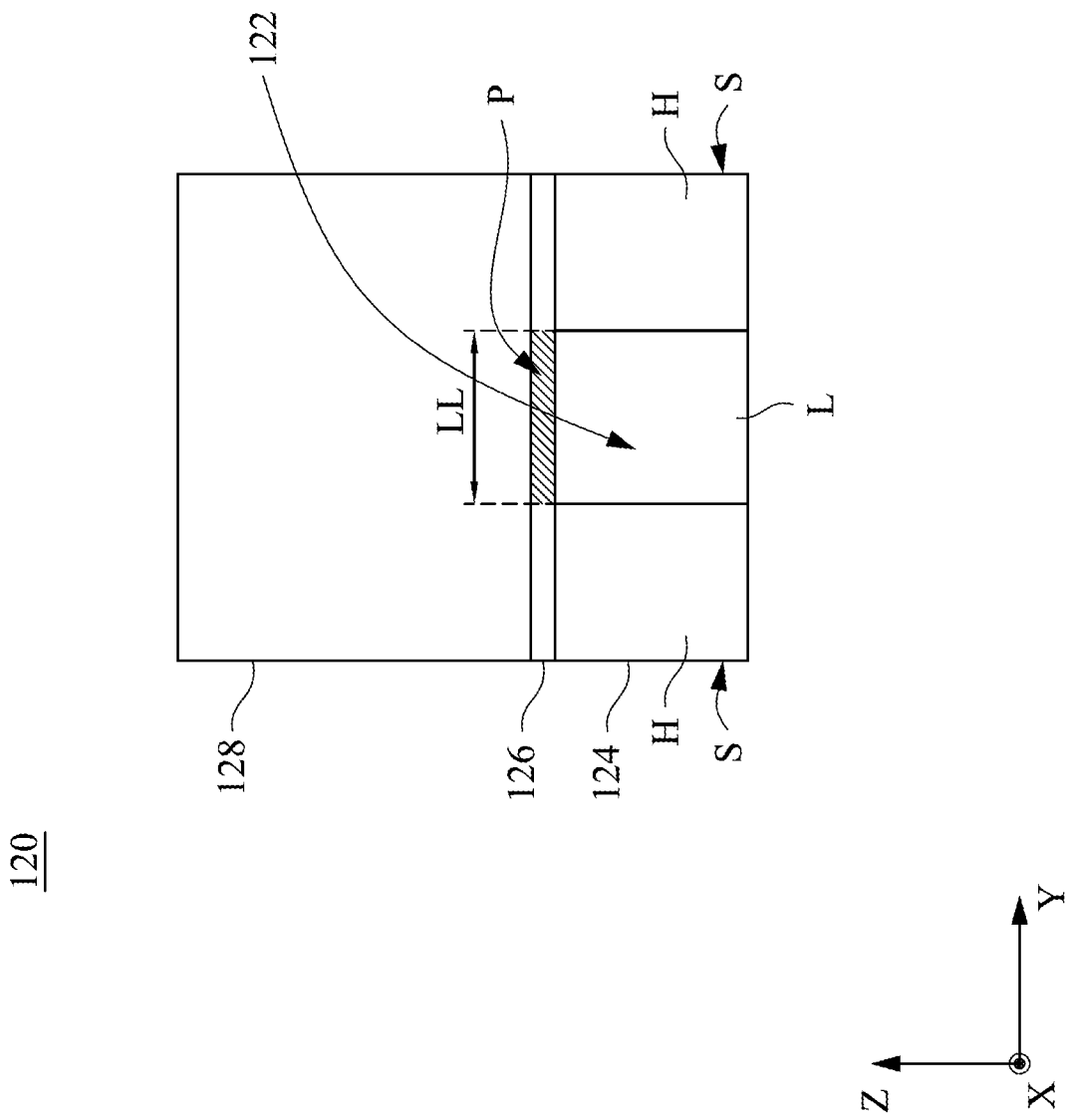
FIG. 1B is an enlarged cross-sectional view of a micro light-emitting diode according to some embodiments of the present disclosure.

Reference is made to FIGS. 1A and 1B. FIG. 1A is a cross-sectional view of a micro light-emitting diode display device 100a according to some embodiments of the present disclosure. FIG. 1B is an enlarged cross-sectional view of a micro light-emitting diode 120 according to some embodiments of the present disclosure. In some embodiments, a micro light-emitting diode display device 100a includes a driving transistor 110a and a micro light-emitting diode 120. The driving transistor 110a includes a substrate 111, a gate 112, a gate insulator 113, a semiconductor layer 114, a drain electrode 115, and a source electrode 116. The substrate 111 can be a glass substrate, or a quartz substrate. The gate 112 is on the substrate 111. In some embodiments, the gate insulator 113 is on and in contact with the substrate 111 and the gate 112. The gate insulator 113 has a thickness less than or equal to about 500 angstroms (Å), such that a threshold voltage of the driving transistor 110a is significantly decreased compared to a threshold voltage of a conventional thin film transistor. Specifically, the threshold voltage of the conventional thin film transistor is about 6 volts (V) with a conventional gate insulator having a thickness about 1500 Å, while the threshold voltage of the driving transistor 110a can be lowered to about 0.8 V when the thickness of the gate insulator 113 is about 200 Å. The gate insulator 113 can be a low-k dielectric layer or a high-k dielectric layer. The semiconductor layer 114 is on the gate insulator 113. A material of the semiconductor layer 114 can include (hydrogenated) amorphous silicon (a-Si:H), indium gallium zinc oxide (IGZO), gallium zinc oxide (GZO), or indium zinc oxide (IZO), but should not be limited thereto. A vertical projection of at least a portion of the semiconductor layer 114 on the substrate 111 is overlapped with a vertical projection of the gate 112 on the substrate 111. The drain electrode 115 is on the semiconductor layer 114. The source electrode 116 is on the semiconductor layer 114 and is spaced apart from the drain electrode 115. In order to reach ohmic contacts between the drain electrode 115 and the semiconductor layer 114 and between the source electrode 116 and the semiconductor layer 114, contact portions thereof can be heavily doped. Said heavy doping can also have a hole blocking function to prevent a hole leakage through the contact portions. Therefore, in some embodiments, the semiconductor layer 114 further includes highly conductive n+a-Si:H films 1142, especially when the semiconductor layer 114 is a-Si:H as mentioned. The highly conductive n+a-Si:H films 1142 are between the drain electrode 115 and the semiconductor layer 114 and between the source electrode 116 and the semiconductor layer 114. Normally, the highly conductive n+a-Si:H films 1142 have a resistivity which is about seven orders magnitude lower than that of the intrinsic a-Si:H. In some other embodiments, such as the semiconductor layer 114 being an IGZO layer, said n+ doped films may not be necessary since the IGZO layer has much fewer hole carriers than that of a-Si:H, and the contact between the IGZO layer and the drain/source electrodes 115/116 is much better (i.e., closer to the ohmic contact) than that between the a-Si:H and the drain/source electrodes 115/116.

In some embodiments, the micro light-emitting diode 120 has a lateral length less than or equal to about 50 μm and is electrically connected to one of the source electrode 116 and the drain electrode 115. The micro light-emitting diode 120 includes a first type semiconductor layer 124, an active layer 126, and a second type semiconductor layer 128. The active layer 126 is on and joined with the first type semiconductor layer 124. The second type semiconductor layer 128 is on and joined with the active layer 126. A current injection channel 122 is extended within one of the first type semiconductor layer 124 and the second type semiconductor layer 128 and is spaced apart from a side surface S of the micro light-emitting diode 120, and the active layer 126 has a portion P in contact with the current injection channel 122. The portion P has a lateral length LL less than or equal to about 10 μm (i.e., a lateral length or a diameter of a light-emitting portion is less than or equal to about 10 μm). The current injection channel 122 and the portion P of the active layer 126 can be constructed by at least the following structure. One of the first type semiconductor layer 124 and the second type semiconductor layer 128 includes a low resistance portion L and a high resistance portion H. The low resistance portion L is separated from at least one side surface S of said one of the first type semiconductor layer 124 and the second type semiconductor layer 128 by the high resistance portion H. The resistivity of said one of the first type semiconductor layer 124 and the second type semiconductor layer 128 increases from the low resistance portion L toward the high resistance portion H. The low resistance portion L can thus form the current injection channel 122. The formation of the high resistance portion H can be performed by a metal diffusive doping such as silicon (Si) or titanium (Ti) doping, but should not be limited thereto. Lateral lengths (in a direction parallel to extensions of the substrate 111, or in a direction parallel to an X-Y plane, which is perpendicular to a thickness direction Z) of the first type semiconductor layer 124, the active layer 126, and the second type semiconductor layer 128 are less than or equal to about 50 μm.

With the existence of the current injection channel 122 and a restricted light-emitting area of the active layer 126 formed by the portion P in contact with the current injection channel 122, a current density flowing through the micro light-emitting diode 120 increases due to a reduction of a light-emitting area of the active layer 126. Besides, a surface recombination (which is a non-radiative recombination) is avoided due to an isolation of the current injection channel 122 from the side surface S of the micro light-emitting diode 120, so as to decrease the current leakage. As a result, a voltage needed to light up the micro light-emitting diode 120 can be reduced.

In some embodiments, the micro light-emitting diode display device 100a further includes a connecting electrode 119 on the substrate 111 and in contact with one of the source electrode 116 and the drain electrode 115. In the embodiments as shown in FIG. 1A, the connecting electrode 119 is in contact with the source electrode 116. In some embodiments, the micro light-emitting diode display device 100a further includes a bottom electrode 130 on the substrate 111. The bottom electrode 130 is in contact with the connecting electrode 119 of the driving transistor 110a. In some embodiments, the first type semiconductor layer 124 is on and in contact with the bottom electrode 130. With the combination of said driving transistor 110a and the light-emitting diode 120, a low power driving scheme can be realized. The low power driving scheme will be mentioned again later with more details.

Figure 2:
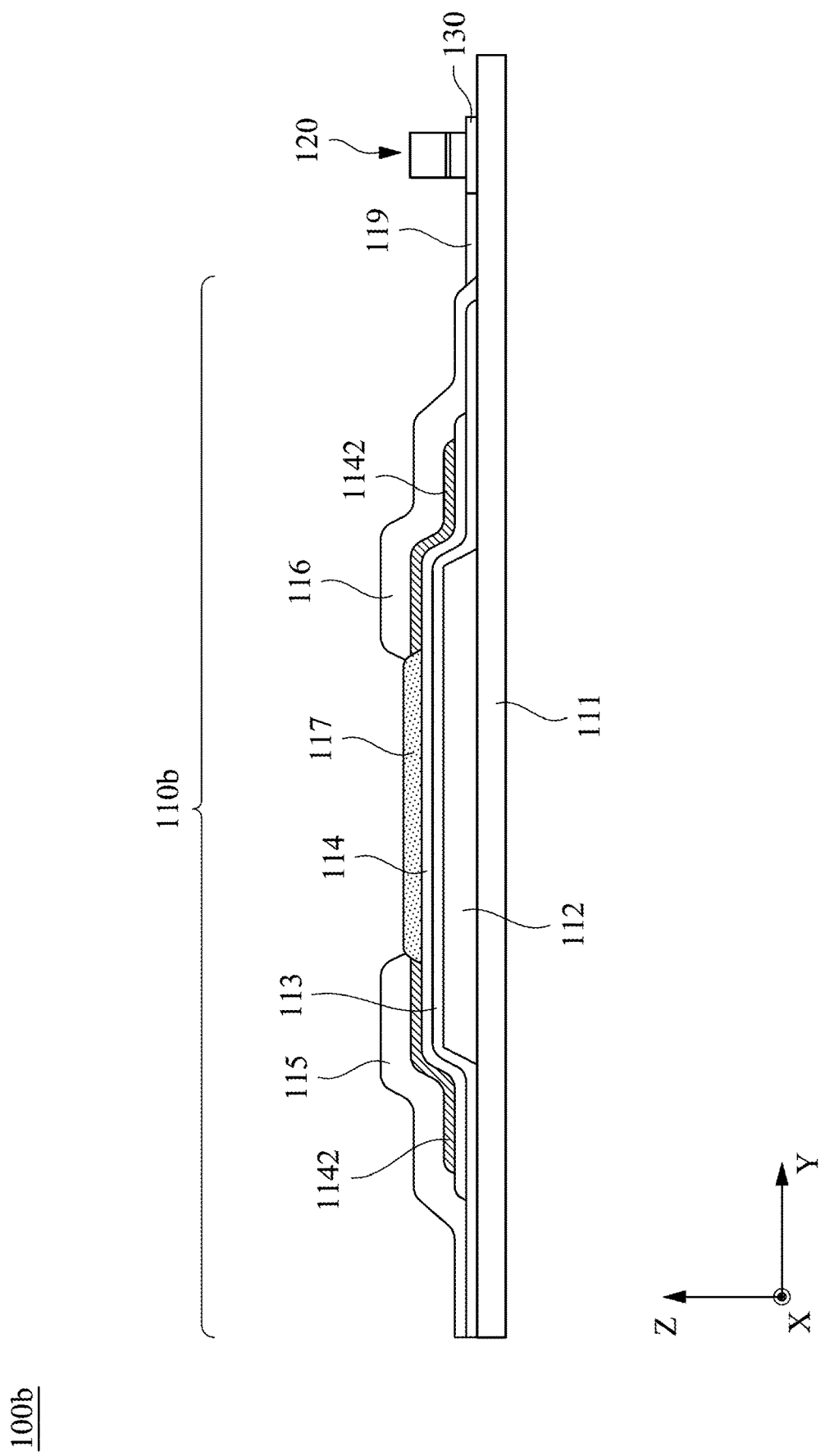
FIG. 2 is a cross-sectional view of a micro light-emitting diode display device according to some embodiments of the present disclosure.

Reference is made to FIG. 2. FIG. 2 is a cross-sectional view of a micro light-emitting diode display device 100b according to some embodiments of the present disclosure. In some embodiments, the driving transistor 110b further includes an etch stopper 117 on the semiconductor layer 114 as compared to the driving transistor 110a as shown in FIG. 1A. The etch stopper 117 is in contact with the drain electrode 115 and the source electrode 116. In some embodiments, at least a portion of the etch stopper 117 between the drain electrode 115 and the source electrode 116 is exposed and not covered by the drain electrode 115 and the source electrode 116. The etch stopper 117 can protect the underlying semiconductor layer 114 from damages during an etching process, so as to maintain the quality of the semiconductor layer 114.

Figure 3:
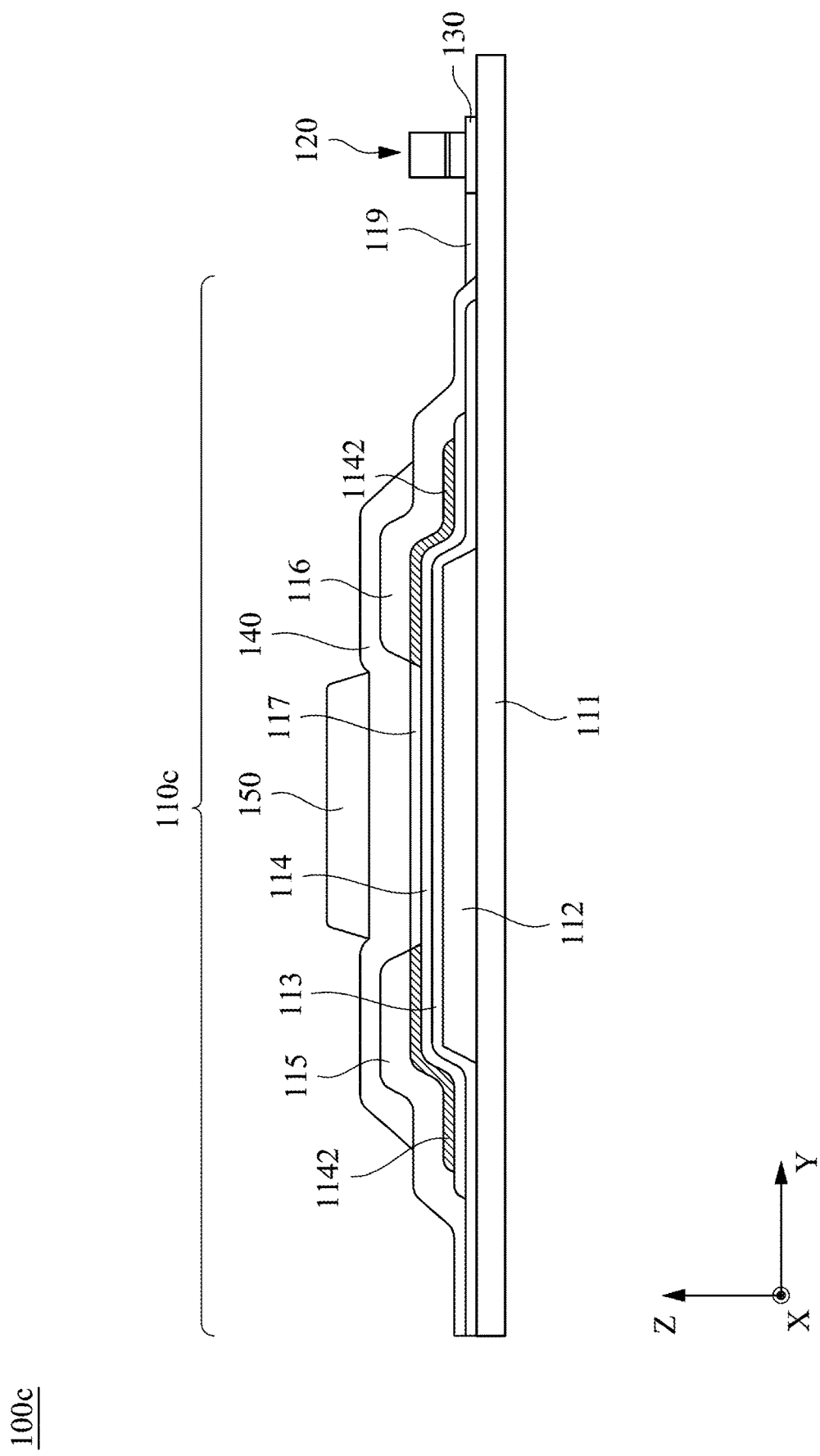
FIG. 3 is a cross-sectional view of a micro light-emitting diode display device according to some embodiments of the present disclosure.

Reference is made to FIG. 3. FIG. 3 is a cross-sectional view of a micro light-emitting diode display device 100c according to some embodiments of the present disclosure. In some embodiments, the driving transistor 110c further includes a top gate insulator 140 and a top gate 150 as compared to the driving transistor 110a as shown in FIG. 1A. The top gate insulator 140 is on the semiconductor layer 117. The top gate 150 is on the top gate insulator 140. In some embodiments, the top gate insulator 140 has a thickness less than or equal to about 500 Å, but should not be limited thereto. In some embodiments, a vertical projection of the top gate 150 on the substrate 111 is overlapped with a vertical projection of at least a portion of the gate 112 on the substrate 111, such that a gate voltage of at least a part of semiconductor layer 114 can be modified simultaneously by the top gate 150 and the gate 112. In this dual gate configuration, carriers can be induced in the semiconductor layer 114 on both sides respectively facing the top gate 150 and the gate 112, and thicknesses of channels for carriers to flow through on surfaces of two opposite sides of the semiconductor layer 114 also increase compared to single gate (gate or top gate) configurations because one channel is influenced by both the gate 112 and the top gate 150. As a result, resistivities of the channels decreases, and the reliability increases compared to the single gate configurations.

Figure 4:
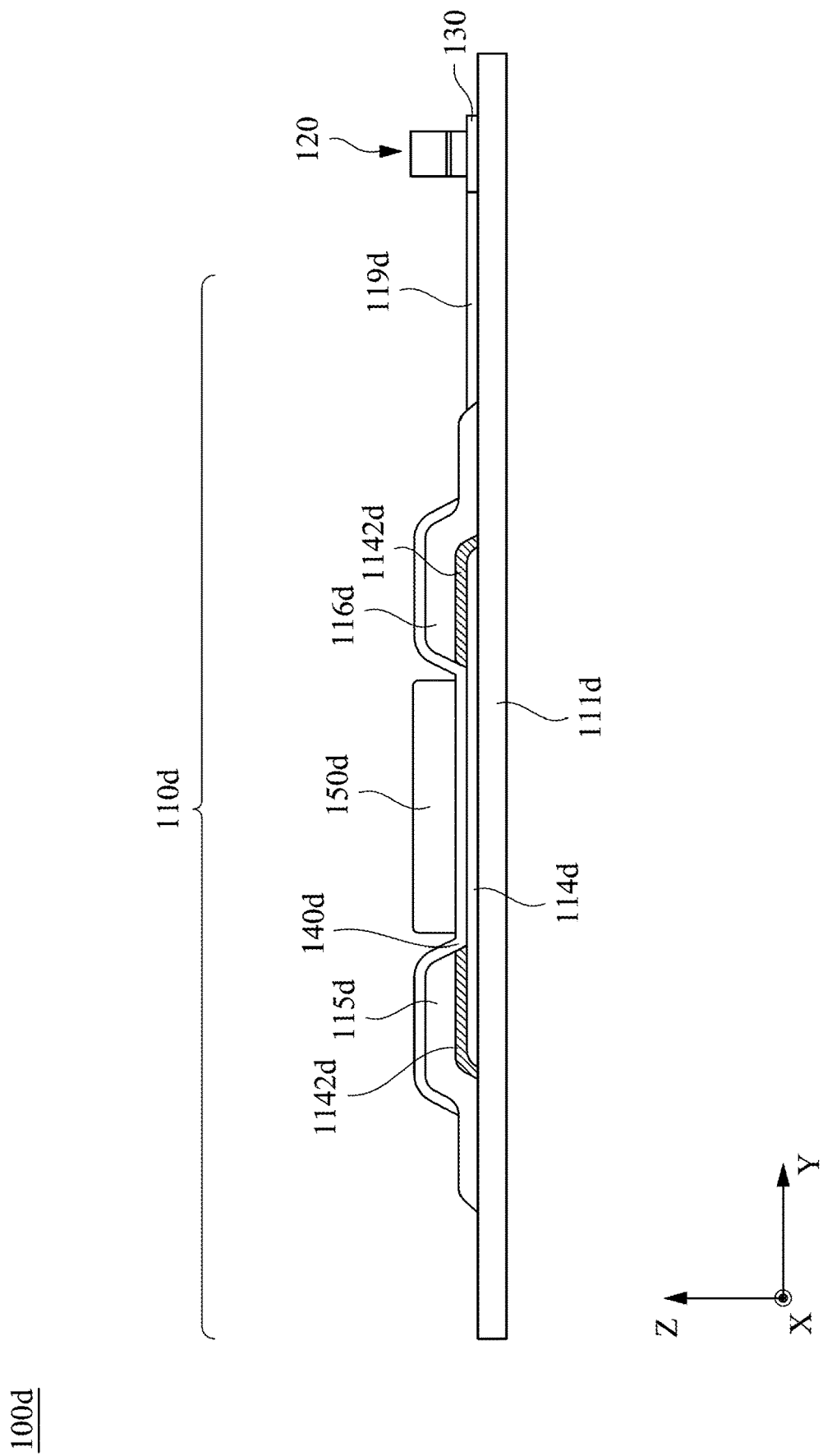
FIG. 4 is a cross-sectional view of a micro light-emitting diode display device according to some embodiments of the present disclosure.

Reference is made to FIG. 4. FIG. 4 is a cross-sectional view of a micro light-emitting diode display device 100d according to some embodiments of the present disclosure. In some embodiments, the micro light-emitting diode display device 100d including a driving transistor 110d and the micro light-emitting diode 120 is provided. The driving transistor 110d includes a substrate 111d, a semiconductor layer 114d, a drain electrode 115d, a source electrode 116d, a gate insulator 140d, and a gate 150d. The semiconductor layer 114d is on the substrate 111d. A material of the semiconductor layer 114d can be a low temperature polysilicon (LTPS), but should not be limited thereto. The drain electrode 115d is on the semiconductor layer 114d. The source electrode 116d is on the semiconductor layer 114d and is spaced apart from the drain electrode 115d. The gate insulator 140d has a thickness less than or equal to about 500 Å and is on the semiconductor layer 114d, the drain electrode 115d, and the source electrode 116d. The gate 150d is on the gate insulator 140d. Briefly speaking, the embodiments illustrated by FIG. 4 are top gate cases without any bottom gate.

In some embodiments, the micro light-emitting diode display device 100d further includes a connecting electrode 119d on the substrate 111d and is in contact with the source electrode 116d. The gate 150d is electrically isolated from the source electrode 116d and the drain electrode 115d by the gate insulator 140d. In some embodiments, the micro light-emitting diode display device 100d further includes a bottom electrode 130 on the substrate 111d and is in contact with the connecting electrode 119d of the driving transistor 110d. In some embodiments, the micro light-emitting diode 120 is in contact with the bottom electrode 130.

Figure 5:
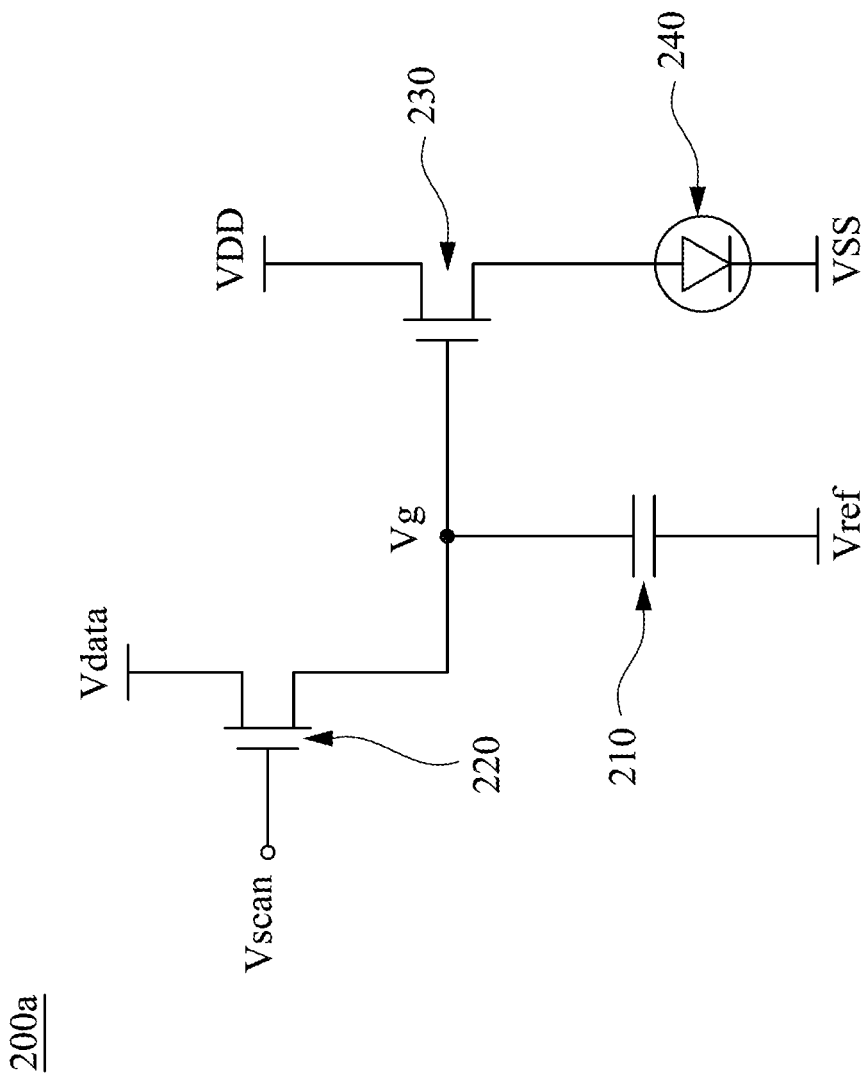
FIG. 5 is a schematic diagram of a micro light-emitting diode driving circuit in some embodiments of the present disclosure.

Reference is made to FIG. 5. FIG. 5 is a schematic diagram of a micro light-emitting diode driving circuit 200a in some embodiments of the present disclosure. The micro light-emitting diode driving circuit 200a includes a storage capacitor 210, a switching transistor 220, a driving transistor 230, and a micro light-emitting diode 240. The storage capacitor 210 has two ends, and one of the two ends can be connected to a reference signal Vref. The switching transistor 220 has three terminals. One of the three terminals is a gate terminal connected to a scan line Vscan, another one of the three terminals is a drain terminal connected to a data line Vdata, and a remaining one of the three terminals is a source terminal connected to the other end of the storage capacitor 210. The driving transistor 230 has a gate terminal configured to receive an applied gate voltage Vg and is connected to the source terminal of the switching transistor 220. The driving transistor 230 has a drain terminal and a source terminal. The drain terminal of the driving transistor 230 is connected to a driving voltage source VDD. It should be noted that the driving transistor 230 described herein is intended for the driving transistors as illustrated by the embodiments shown in FIG. 1A and FIGS. 2 to 4. Specifically, the drain terminal and the source terminal of the driving transistor 230 respectively correspond to (i.e., serve as) the drain electrode (e.g., the drain electrodes 115,115d) and the source electrode (e.g., the source electrodes 116, 116d), and the gate terminal of the driving transistor corresponds to (i.e., serves as) the gates or the top gate (e.g., the gates 112, 150d or the top gate 150).

The micro light-emitting diode driving circuit 200a also includes a micro light-emitting diode 240. The micro light-emitting diode 240 has an anode connected to the source terminal of the driving transistor 230 and a cathode connected to a low voltage source VSS. It should be noted that the micro light-emitting diode 240 described herein is intended for the micro light-emitting diode (e.g., the micro light-emitting diode 120) as illustrated by the embodiment shown in FIGS. 1A, 1B, and 2 to 4. In some embodiments, the anode can correspond to (i.e., serve as) the bottom electrode 130 of the micro light-emitting diode 120.

From the embodiments such as FIGS. 1A, 1B and 5 which include the combination of the driving transistor 110a (acts as the driving transistor 230) and the micro light-emitting diode 120 with the current injection channel 122 therein (acts as the micro light-emitting diode 240) in the micro light-emitting diode driving circuit 200a as shown above, a voltage applied by the driving voltage source VDD can be lowered to be less than about 6 V but still in the working range of light-emitting mode of the micro light-emitting diode 120, so that a low power micro light-emitting diode driving circuit can be realized compared to a thin film transistor with a conventional organic light-emitting diodes (OLED). Specifically, since a driving voltage applied in a circuit with a conventional transistor and an OLED therein shall be at least higher than or equal to 7 V to light up the OLED and a working range of the OLED is equal to or greater than about 5V, as a comparison, the embodiments of the present disclosure can reduce the power consumption of a circuit. There are two structural features in combination which shall be satisfied to achieve said reduction of power consumption. One is the gate insulator (e.g. the gate insulator 113) having the thickness less than or equal to about 500 Å, such that the threshold voltage of the driving transistor 110a can be lowered (to about 0.8 V when said thickness is about 200 Å), and a saturation region on current-to-voltage curves of the driving transistor 110a which is normally adopted to drive a light-emitting device extends to a lower voltage compared to a conventional thin film transistor. However, it is still not suitable for the low power consumption because the driving voltage VDD depends on not only a drain-to-source voltage VDS of the driving transistor 230 but also a voltage across the micro light-emitting diode 240 as expressed in an equation I: VDD=VDS+Vd. The equation I can be directly derived from the circuitry illustrated by FIG. 5. From the equation I, although VDS is reduced by said thinner gate insulator 113, Vd still dominates the power consumption. Therefore, a second structural feature in which the current injection channel 122 in the micro light-emitting diode 120 is provided to solve the problem. The current injection channel 122 shall be separated from the side surface S of the micro light-emitting diode 120, such as embodiments illustrated by FIG. 1B. In such a configuration, a current density flowing through the micro light-emitting diode 120 increases due to a reduction of a light-emitting area of the active layer 126, and the surface recombination is substantially avoided, such that a voltage needed to light up the micro light-emitting diode can be reduced to be less than about 3 V, and a working range of said micro light-emitting diode 120 is about 2 V (e.g., from about 2.5 V to about 4 V). As a result, the driving voltage source VDD less than about 6 V can be realized. In some embodiments, the driving voltage source VDD is less than about 5 V.

Figure 6:
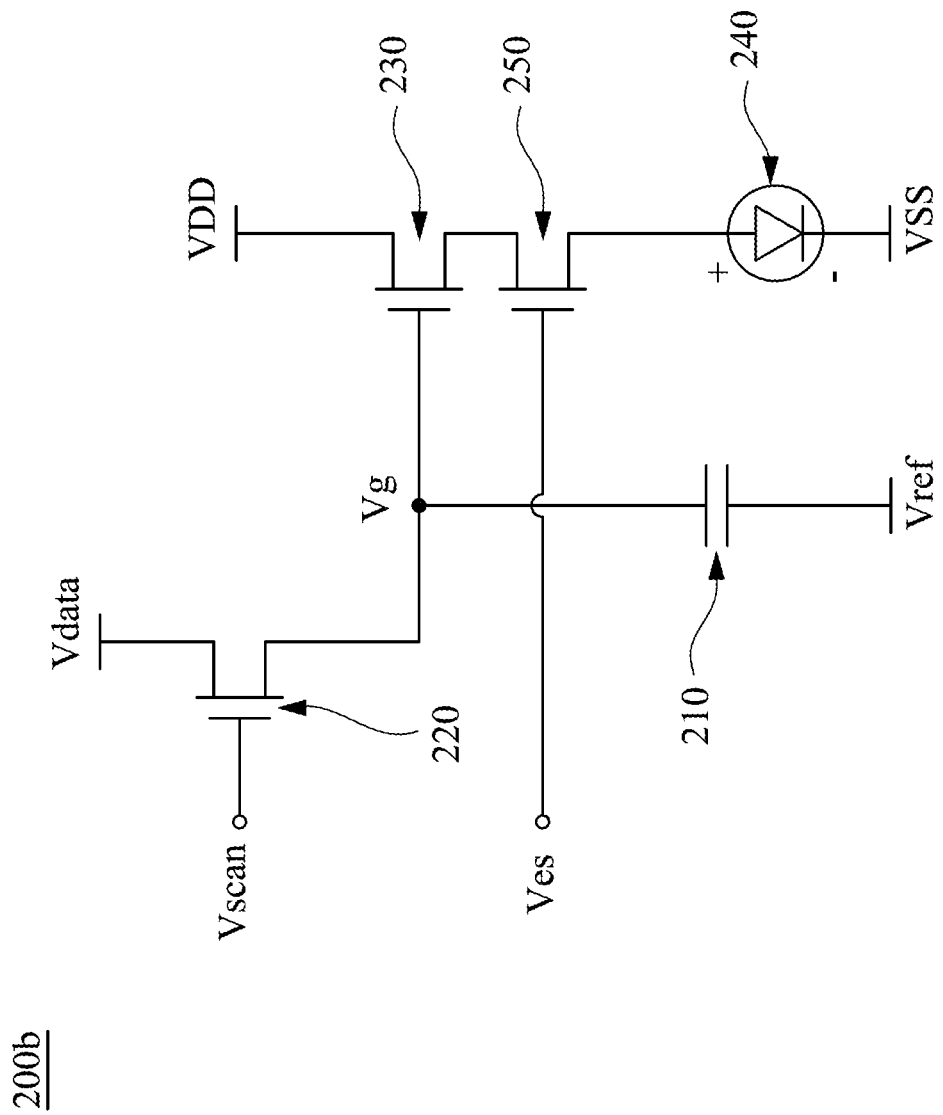
FIG. 6 is a schematic diagram of a micro light-emitting diode driving circuit in some embodiments of the present disclosure.

Reference is made to FIG. 6. FIG. 6 is a schematic diagram of a micro light-emitting diode driving circuit 200b in some embodiments of the present disclosure. In some embodiments, the micro light-emitting diode driving circuit 200b as shown in FIG. 6 further includes an emission control transistor 250 as compared to the micro light-emitting diode driving circuit 200a as shown in FIG. 5. The emission control transistor 250 has three terminals. One of the three terminals is a gate terminal connected to an emission signal Ves. The emission control transistor 250 is electrically connected to the driving transistor 230 and the micro light-emitting diode 240 in series as shown in FIG. 6. In some embodiments, another one of the three terminals is a drain terminal connected to the source terminal of the driving transistor 230, and a remaining one of the three terminals is a source terminal connected to the anode of the micro light-emitting diode 240, as shown in FIG. 6. The emission control transistor 250 can give an ON/OFF function in a specified frequency to modify the brightness of the micro light-emitting diode 120. It should be noted that other equivalent connecting ways performing similar functions of said emission control transistor 250 does not depart the scope of the present disclosure. In some embodiments, each of the switching transistor 220 and the emission control transistor 250 can also have a gate insulator having a thickness less than or equal to about 500 Å, such that voltages applied to the switching transistor 220 and the emission control transistor 250 can be respectively reduced and thus low power consumptions of the switching transistor 220 and the emission control transistor 250 are achieved.

Figure 7A:
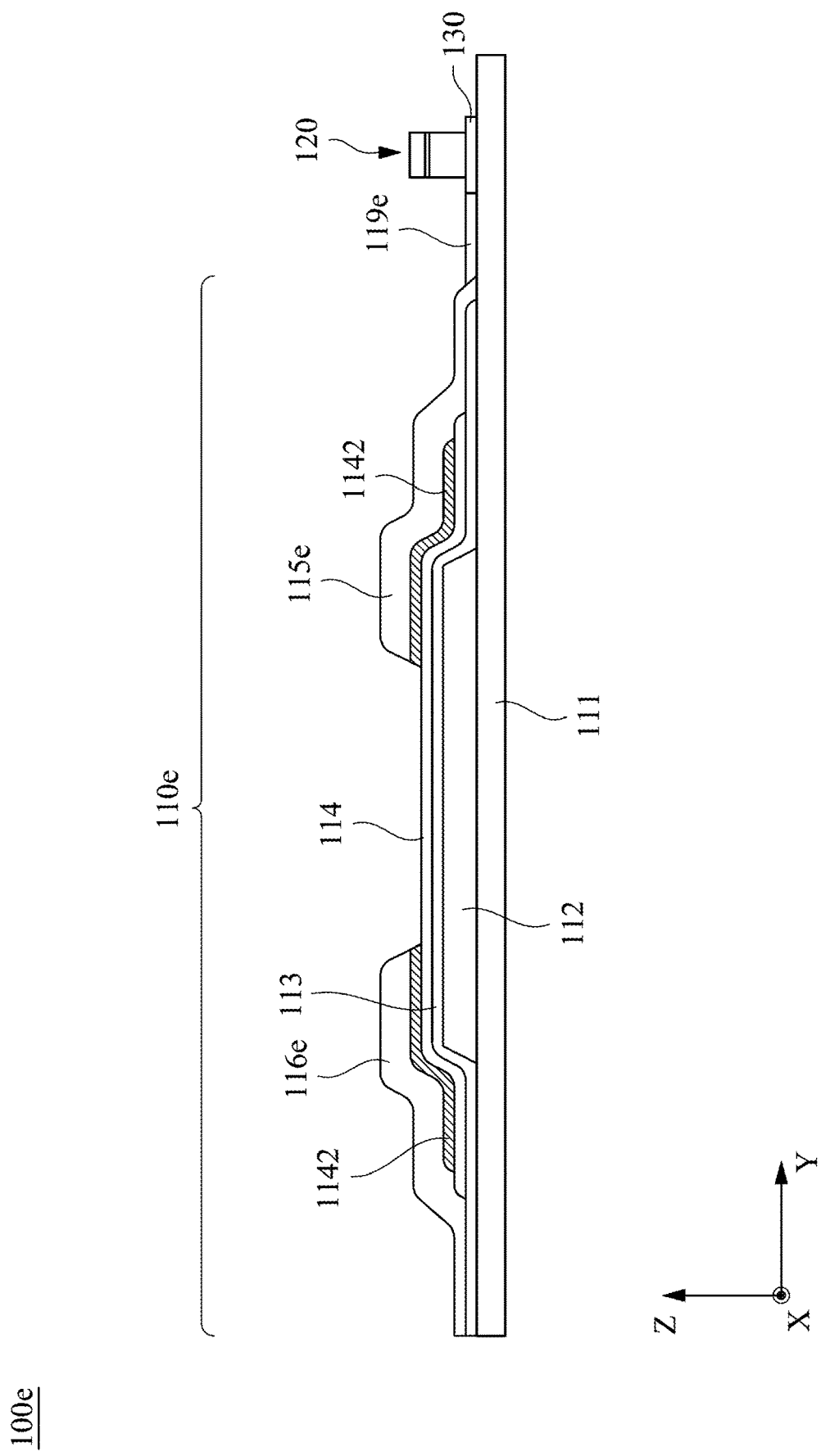
FIG. 7A is a cross-sectional view of a micro light-emitting diode display device according to some embodiments of the present disclosure.
Figure 7B:
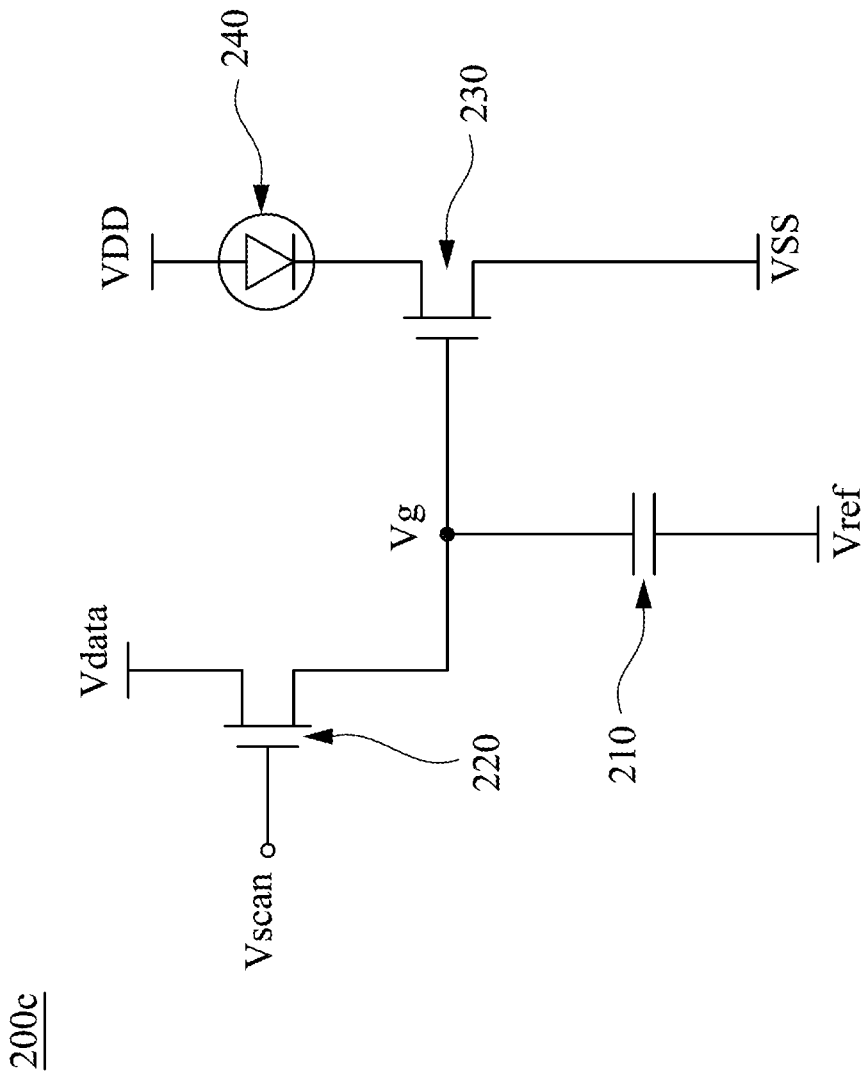
FIG. 7B is a schematic diagram of a micro light-emitting diode driving circuit in some embodiments of the present disclosure.

It should be noted that some minor modifications on a sequence of circuit elements in circuitries as mentioned in the embodiments of the present disclosure do not depart from the claimed scope. An example is shown below. Reference is made to FIGS. 7A and 7B. FIG. 7A is a cross-sectional view of a micro light-emitting diode display device 100e according to some embodiments of the present disclosure. FIG. 7B is a schematic diagram of a micro light-emitting diode driving circuit 200c in some embodiments of the present disclosure. In some embodiments, the connecting electrode 119e is electrically connected to the drain electrode 115e, and is electrically isolated from the source electrode 116e. The configuration is shown in FIG. 7A, and the corresponding micro light-emitting diode driving circuit 200c is shown in FIG. 7B. Specifically, in the above configuration, since the connecting electrode 119e is electrically connected to the drain electrode 115e, the micro light-emitting diode 120 shall be in an upside-down way compared to that in FIG. 1A. That is, the second type semiconductor layer 128 (e.g., the n-type semiconductor layer) is in contact with the bottom electrode 130, and the bottom electrode 130 is in contact with the connecting electrode 119e. The above structure is reflected on the micro light-emitting diode driving circuit 200c by interchanging positions of the driving transistor 230 and the micro light-emitting diode 240, such that the anode of the micro light-emitting diode 240 is connected to the driving voltage source VDD, and the cathode of the micro light-emitting diode 240 is connected to the drain electrode 115e of the driving transistor 230. The source electrode 116e of the driving transistor 230 is connected to the low voltage source VSS, as shown in FIG. 7B.

It should also be noted that the above advantages cannot be achieved by a driving circuit based on a conventional OLED since a minimum voltage to light up an OLED (i.e., forward voltage of the OLED) shall generally be higher than or equal to about 7 V, and the working range of the OLED is equal to or greater than about 5 V. It is the design of the current injection channel plus the ultra-thin gate insulator (e.g., with a thickness less than or equal to about 500 Å) that makes the low power driving feasible.

In summary, a micro light-emitting diode display device including a driving transistor with a gate insulator having a thickness less than or equal to about 500 Å and a micro light-emitting diode with a current injection channel and a light-emitting portion of an active layer having lateral length less than or equal to about 10 μm is provided in some embodiments of the present disclosure to realize a low power consumption micro light-emitting diode display device and a low power consumption micro light-emitting diode driving circuit.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A micro light-emitting diode display device, comprising:
    a driving transistor comprising:
        a substrate;
        a gate on the substrate;
        a gate insulator having a thickness less than or equal to about 500 angstroms and on the gate and the substrate;
        a semiconductor layer on the gate insulator;
        a drain electrode on the semiconductor layer; and
        a source electrode on the semiconductor layer and spaced apart from the drain electrode; and
    a micro light-emitting diode having a lateral length less than or equal to about 50 μm and electrically connected to one of the source electrode and the drain electrode, the micro light-emitting diode comprising:
        a first type semiconductor layer;
        an active layer on and joined with the first type semiconductor layer; and
        a second type semiconductor layer on and joined with the active layer, wherein a current injection channel is extended within one of the first type semiconductor layer and the second type semiconductor layer and spaced apart from a side surface of the micro light-emitting diode, and the active layer has a portion in contact with the current injection channel and having a lateral length less than or equal to about 10 μm.

2. The micro light-emitting diode display device of claim 1, further comprising an etch stopper on the semiconductor layer of the driving transistor and in contact with the drain electrode and the source electrode, wherein at least a portion of the etch stopper between the drain electrode and the source electrode is exposed.

3. The micro light-emitting diode display device of claim 1, further comprising a connecting electrode on the substrate and in contact with one of the source electrode and the drain electrode.

4. The micro light-emitting diode display device of claim 3, further comprising a bottom electrode on the substrate and in contact with the connecting electrode, and the micro light-emitting diode being in contact with the bottom electrode.

5. The micro light-emitting diode display device of claim 1, further comprising:
    a top gate insulator on the semiconductor layer; and
    a top gate on the top gate insulator.

6. The micro light-emitting diode display device of claim 5, wherein a vertical projection of the top gate on the substrate is overlapped with a vertical projection of at least a portion of the gate on the substrate.

7. A micro light-emitting diode display device, comprising:
    a driving transistor comprising:
        a substrate;
        a semiconductor layer on the substrate;
        a drain electrode on the semiconductor layer;
        a source electrode on the semiconductor layer and spaced apart from the drain electrode;
        a gate insulator having a thickness less than or equal to about 500 angstroms and on the semiconductor layer; and
        a gate on the gate insulator;
    a micro light-emitting diode having a lateral length less than or equal to about 50 μm and electrically connected to one of the source electrode and the drain electrode, comprising:
    a first type semiconductor layer;
    an active layer on and joined with the first type semiconductor layer; and
    a second type semiconductor layer on and joined with the active layer, wherein a current injection channel is extended within one of the first type semiconductor layer and the second type semiconductor layer and spaced apart from a side surface of the micro light-emitting diode, and the active layer has a portion in contact with the current injection channel and having a lateral length less than or equal to about 10 μm.

8. The micro light-emitting diode display device of claim 7, further comprising a connecting electrode on the substrate and in contact with one of the source electrode and the drain electrode.

9. The micro light-emitting diode display device of claim 8, further comprising a bottom electrode on the substrate and in contact with the connecting electrode, and the micro light-emitting diode being in contact with the bottom electrode.

10. A micro light-emitting diode driving circuit, comprising:
    a storage capacitor having two ends;
    a switching transistor having a gate terminal connected to a scan line, a drain terminal connected to a data line, and a source terminal connected to one end of the storage capacitor;
    a micro light-emitting diode having a lateral length less than or equal to about 50 μm and comprising:
        a first type semiconductor layer;
        an active layer on and joined with the first type semiconductor layer; and
        a second type semiconductor layer on and joined with the active layer, wherein a current injection channel is extended within one of the first type semiconductor layer and the second type semiconductor layer and spaced apart from a side surface of the micro light-emitting diode, and the active layer has a portion in contact with the current injection channel and having a lateral length less than or equal to about 10 μm, the micro light-emitting diode having an anode and a cathode respectively connected to the first type semiconductor layer and the second type semiconductor layer, and the micro light-emitting diode receives a first driving voltage from a driving voltage source and is electrically connected to a low voltage source; and
    a driving transistor having a gate terminal, a drain terminal, and a source terminal, the gate terminal being connected to the source terminal of the switching transistor, the micro light-emitting diode being electrically connected to one of the source terminal and the drain terminal of the driving transistor, the driving transistor receiving a second driving voltage from the driving voltage source and being electrically connected to the low voltage source, the driving transistor being one of a first structure, a second structure and a third structure, wherein
    the first structure comprises:
        a first substrate;
        a first gate on the first substrate;
        a first gate insulator having a thickness less than or equal to about 500 angstroms on the first gate;
        a first semiconductor layer on the first gate insulator;
        a first drain electrode on the first semiconductor layer; and
        a first source electrode on the first semiconductor layer and spaced apart from the first drain electrode;
    the second structure comprises:
        a second substrate;
        a second gate on the second substrate;
        a second gate insulator having a thickness less than or equal to about 500 angstroms on the second gate;
        a second semiconductor layer on the second gate insulator;
        a second drain electrode on the second semiconductor layer;
        a second source electrode on the second semiconductor layer and spaced apart from the second drain electrode;
        a top gate insulator on the second semiconductor layer; and
        a top gate on the top gate insulator;
    the third structure comprises:
        a third substrate;
        a third semiconductor layer on the third substrate;
        a third drain electrode on the third semiconductor layer;
        a third source electrode on the third semiconductor layer and spaced apart from the third drain electrode;
        a third gate insulator having a thickness less than or equal to about 500 angstroms on the third semiconductor layer; and
        a third gate on the third gate insulator.

11. The micro light-emitting diode driving circuit of claim 10, further comprising an emission control transistor having a gate terminal connected to an emission signal, the emission control transistor being electrically connected to the driving transistor and the micro light-emitting diode in series.

12. The micro light-emitting diode display device of claim 7, wherein the semiconductor layer is sandwiched between the gate and the substrate.

* * * * *